(12) United States Patent
Yang et al.

(10) Patent No.: US 10,756,256 B2
(45) Date of Patent: Aug. 25, 2020

(54) MAGNETORESISTIVE RANDOM ACCESS MEMORY AND METHOD FOR MANUFACTURING THE SAME

(71) Applicant: INSTITUTE OF MICROELECTRONICS, CHINESE ACADEMY OF SCIENCES, Beijing (CN)

(72) Inventors: Meiyin Yang, Beijing (CN); Jun Luo, Beijing (CN); Tengzhi Yang, Beijing (CN); Jing Xu, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 16/411,517

(22) Filed: May 14, 2019

(65) Prior Publication Data

US 2020/0212293 A1    Jul. 2, 2020

(30) Foreign Application Priority Data

Dec. 26, 2018 (CN) .......................... 2018 1 1604863

(51) Int. Cl.
| | |
|---|---|
| *H01L 27/22* | (2006.01) |
| *H01L 43/02* | (2006.01) |
| *H01L 43/12* | (2006.01) |
| *H01F 10/32* | (2006.01) |
| *H01F 41/30* | (2006.01) |
| *G11C 11/16* | (2006.01) |
| *H01L 43/10* | (2006.01) |

(52) U.S. Cl.
CPC ............ *H01L 43/02* (2013.01); *G11C 11/161* (2013.01); *H01F 10/3254* (2013.01); *H01F 10/3268* (2013.01); *H01F 10/3286* (2013.01); *H01F 41/302* (2013.01); *H01L 43/12* (2013.01); *H01L 27/222* (2013.01); *H01L 43/10* (2013.01)

(58) Field of Classification Search
CPC .................. H01L 27/22–228; H01L 43/00–14
See application file for complete search history.

(56) References Cited

U.S. PATENT DOCUMENTS

2008/0164502 A1* 7/2008 Fukumoto ............. H01L 27/222
                                                             257/295

* cited by examiner

*Primary Examiner* — Daniel P Shook
(74) *Attorney, Agent, or Firm* — Goodwin Procter LLP

(57) ABSTRACT

A magnetoresistive random access memory and a method for manufacturing the same are provided, with which a stress layer covers a part of the protective layer along a direction of a current in the spin-orbit coupling layer, so that a stress is generated on the part of the magnetic layer locally due to the stress layer, thus a lateral asymmetric structure is formed in a direction perpendicular to the current source. In a case that a current is supplied to the spin-orbit coupling layer, the spin-orbit coupling effect in the magnetic layer is asymmetric due to the stress on the part of the magnetic layer, thereby realizing a deterministic switching of the magnetic moment under the function of the stress.

12 Claims, 9 Drawing Sheets

MAGNETORESISTIVE RANDOM ACCESS MEMORY AND METHOD FOR MANUFACTURING THE SAME

The present application claims priority to Chinese Patent Application No. 201811604863.4, titled "MAGNETORESISTIVE RANDOM ACCESS MEMORY AND METHOD FOR MANUFACTURING THE SAME", filed on Dec. 26, 2018 with the Chinese Patent Office, which is incorporated herein by reference in its entirety.

FIELD

The present disclosure relates to the technical field of semiconductor devices and method for manufacturing the same, in particular to a magnetoresistive random access memory (MRAM) and a method for manufacturing the same.

BACKGROUND

With the continuous development of the storage technology and the electronic technology, the random access memory is widely used. The random access memory may be independent of or integrated into a device, such as a processor, a dedicated integrated circuit or a system on chip.

A magnetoresistive random access memory (MRAM) is magnetic and performs random storage via the rotation of the magnetic moment. The MRAM has advantages of a high-speed read/write capability, a high integration and is capable of storing data repeatedly for infinite number of times. For a spin-orbit torque MRAM, a spin current is generated due to the spin-orbit coupling, which induces a rotation of the magnetic moment in a magnet. However, the "up" and "down" direction of the rotation for perpendicularly magnetized magnets under the function of the current is random, and a deterministic switching of the magnetic moment is required for effective data access. Therefore, researches have been focusing on how to realize the deterministic switching of the magnetic moment for SOT-MRAM.

SUMMARY

In view of the above, a magnetoresistive random access memory and a method for manufacturing the same are provided according to the present disclosure, to realize a deterministic switching of a magnetic moment in a memory.

The following technical solutions are provided according to the present disclosure.

A spin-orbit torque magnetoresistive random access memory is provided, which includes a spin-orbit coupling layer, a magnetic layer on the spin-orbit coupling layer, a protective layer covering the magnetic layer and a stress layer covering a part of the protective layer along a direction of a current in the spin-orbit coupling layer. The magnetic layer has perpendicular anisotropy.

In an embodiment, the stress layer is made of SiN, $SiO_2$, TiN or Ti.

In an embodiment, the spin-orbit coupling layer is a metal layer, an antiferromagnetic layer or a topological insulator layer.

In an embodiment, the magnetoresistive random access memory further includes a buffer layer under the spin-orbit coupling layer.

In an embodiment, a material of the magnetic layer is Co, Fe, CoPd, FePd, MnGa, CoFeB or FePt.

In an embodiment, the magnetic layer has a strip shape, and the stress layer has a strip shape.

A method for manufacturing a magnetoresistive random access memory is further provided, which includes:
providing a substrate; and
forming a spin-orbit coupling layer, a magnetic layer, a protective layer and a stress layer sequentially on the substrate, where the protective layer covers the magnetic layer, the stress layer covers a part of the protective layer along a direction of a current in the spin-orbit coupling layer. The magnetic layer has perpendicular anisotropy.

In an embodiment, the forming the spin-orbit coupling layer, the magnetic layer, the protective layer and the stress layer sequentially on the substrate includes:
growing a spin-orbit coupling layer material, a magnetic layer material, a protective layer material and a stress layer material sequentially on the substrate;
etching the spin-orbit coupling layer material, the magnetic layer material, the protective layer material and the stress layer material, to pattern the spin-orbit coupling layer material, to form the spin-orbit coupling layer;
etching the magnetic layer material, the protective layer material and the stress layer material, to pattern the magnetic layer material and the protective layer material, to form the magnetic layer and the protective layer; and
etching the stress layer material to form the stress layer.

In an embodiment, the forming the spin-orbit coupling layer, the magnetic layer, the protective layer and the stress layer sequentially on the substrate includes:
forming the spin-orbit coupling layer, the magnetic layer and the protective layer sequentially on the substrate;
forming a second photoresist layer having an opening, wherein the opening exposes the part of the protective layer along the direction of the current in the spin-orbit coupling layer;
growing a stress layer material; and
removing the second photoresist layer to strip the stress layer material on the second photoresist layer, to form the stress layer at the opening.

In an embodiment, the stress layer is made of SiN, $SiO_2$, TiN or Ti.

In an embodiment, the magnetic layer has a square shape, and the stress layer has a square shape.

In an embodiment, before forming the spin-orbit coupling layer on the substrate, the method for manufacturing a magnetoresistive random access memory further includes:
forming a buffer layer on the substrate.

With the magnetoresistive random access memory and the method for manufacturing the same, a stress layer covers a part of the protective layer along a direction of a current in the spin-orbit coupling layer, so that a stress is generated on the part of the magnetic layer locally due to the stress layer. In one aspect, the stress may affects the perpendicular anisotropy of the magnetic layer; in another aspect, the strength of an electric field at the interface between the magnetic layer and the protective layer is changed due to the stress, causing different Rashba effects at the two parts. Due to the above two aspects, a lateral asymmetric structure is formed in a direction perpendicular to the current source. In a case that a current is supplied to the spin-orbit coupling layer, the spin-orbit coupling effect in the magnetic layer is asymmetric due to the stress on the part of the magnetic layer, thereby realizing a deterministic switching of the magnetic moment under the function of the stress.

BRIEF DESCRIPTION OF THE DRAWINGS

For more clearly illustrating embodiments of the present disclosure or the technical solution in the conventional technology, drawings referred to describe the embodiments or the conventional technology are briefly described hereinafter. It is apparent that drawings in the following description only show several embodiments of the present disclosure, and those skilled in the art may obtain other drawings based on these drawings without making any creative effort.

DETAILED DESCRIPTION OF EMBODIMENTS

To make the above features and advantages of the disclosure more apparent and easier to be understood, specific embodiments of the disclosure are illustrated in detail hereinafter in conjunction with the drawings.

Lots of specific details are described in the following description to fully understand the present disclosure, but the disclosure may be implemented in other manners different from those described herein, and those skilled in the art can do similar promotion without departing from the scope of the disclosure, thus the present disclosure is not limited by the specific embodiments disclosed below.

In addition, the present disclosure is described in conjunction with schematic diagrams, sectional views showing the structure of the device may be partially enlarged in accordance with a specific scale for ease of illustration, when describing the embodiments of the present disclosure. Moreover, the schematic diagrams are only schematic, which should not be understood as limiting the scope of protection of the present disclosure. In addition, three-dimensional spatial sizes of a length, a width and a depth should be included in an actual production.

As described in the background part, the magnetic random access memory performs random storage via the rotation of the magnetic moment, and has advantages of a high-speed read/write capability, a high integration and is capable of storing data repeatedly for infinite number of times. A spin current is generated due to the spin-orbit coupling, which induces a rotation of the magnetic moment in a magnet. However, the direction of the rotation of the magnetic moment under the function of the current is random. In this case, it is required to effectively control a deterministic switching of the magnetic moment, to realize an effective data access, which is more conducive to the integration and industrialization of the spin-orbit torque magnetoresistive random access memory.

In view of the above, a magnetoresistive random access memory is provided according to the present disclosure, in which a stress layer covers a part of the protective layer along a direction of a current in the spin-orbit coupling layer, such that a stress is generated on the part of the magnetic layer due to the stress layer, thereby forming a lateral asymmetric structure in a direction perpendicular to the current source. In a case that a current is supplied to the spin-orbit coupling layer, the spin-orbit coupling effect is asymmetric due to the stress on the part of the magnetic layer, thereby realizing a deterministic switching of the magnetic moment under the function of the stress.

Figure 1:
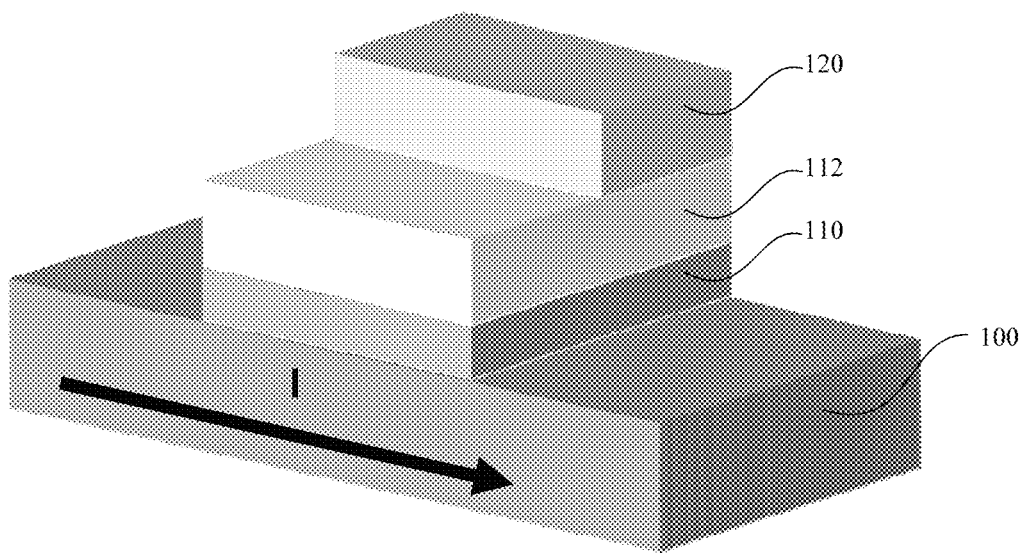
FIG. 1 is a schematic perspective view of a magnetoresistive random access memory according to an embodiment of the present disclosure.
Figure 2:
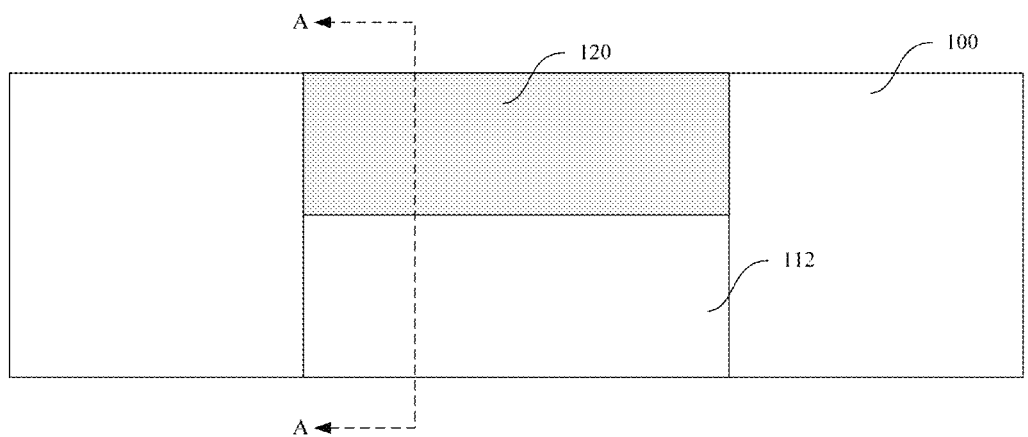
FIG. 2 is a schematic top view of a magnetoresistive random access memory according to an embodiment of the present disclosure.
Figure 3:
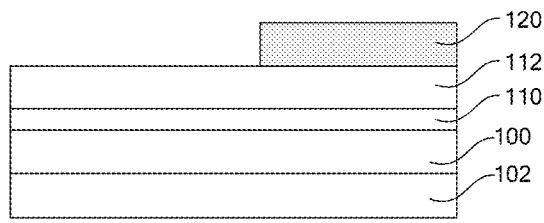
FIG. 3 is a schematic sectional view taken along line A-A in FIG. 2.

Referring to FIGS. 1 to 3, the magnetoresistive random access memory includes a spin-orbit coupling layer 100, a magnetic layer 110 on the spin-orbit coupling layer 100, a protective layer 112 covering the magnetic layer 110, and a stress layer 120 covering a part of the protective layer 112 along a direction of a current I in the spin-orbit coupling layer 100. The magnetic layer 110 has perpendicular anisotropy.

The spin-orbit coupling layer 100 is made of a material having the spin-orbit coupling effect. Generally, the spin-orbit coupling layer 100 may be a metal layer or a topological insulator layer having the spin-orbit coupling effect. Preferably, a material having a large spin-orbit coupling strength may be used. The material of the metal layer may be, for example, Ta, Pt, W, Hf, Ir, CuBi, CuIr or AuW, and the material of the topological insulator layer may be, for example, BiSn, SnTe, BiSe, or a compound from group IVA, group VA and group VIA.

The magnetic layer 110 is made of a ferromagnetic material having perpendicular anisotropy. The ferromagnetic material may be an elemental ferromagnetic material, an alloy ferromagnetic material, a metal oxide having magnetic properties, or the like. For example, the ferromagnetic material may be a hard magnetic material such as Co, Fe, CoFeB or FePt.

The protective layer 112 is provided to protect the magnetic layer 110 from being oxidized. The protective layer 112 covers the magnetic layer 110 completely, and is arranged on the magnetic layer 110 and has substantially the same shape and size as the magnetic layer 110. The protective layer 112 may be generally made of a metal or an oxide material, such as Ta, Ru, $SiO_2$, AlOx.

For ease of description, the direction of the current I is denoted as a length direction of the spin-orbit coupling layer. In an embodiment, the spin-orbit coupling layer 100 may has a strip channel structure. The magnetic layer 110 may be arranged at the middle of the spin-orbit coupling layer 100 along the length direction of the spin-orbit coupling layer 100. The magnetic layer 110 may be symmetrically arranged relative to a central axis along the length direction of the spin-orbit coupling layer 100. In an application, the shape and size of the magnetic layer 110 may be set as needed. In a preferred embodiment, the magnetic layer 110 may has a strip shape, the width of which may be substantially the same as or different from that of the spin-orbit coupling layer 100.

The stress layer 120 may be made of a dielectric material, a metal material or any other material, such as SiN, capable of inducing a stress, for example, a compressive stress or a tensile stress. Typically, the material of the stress layer 120 may be SiN, $SiO_2$, TiN, Ti or the like. The strength and type of stress provided by the stress layer 120 may be determined by adjusting a process condition. Typically, SiN may be deposited through the plasma enhanced chemical vapor deposition (PECVD) process to form the stress layer 120, and the stress layer may be capable of providing a compressive stress or a tensile stress by adjusting the process condition, such as a deposition power, an intracavity pressure, a reaction gas flow ratio and a temperature.

In the embodiment of the present disclosure, the stress layer 120 only covers a part of the protective layer 112 along the direction of the current I in the spin-orbit coupling layer 100. That is, referring to FIG. 1, taking the direction of the current I in the spin-orbiting coupling layer 100 as a reference direction, a part of the protective layer 112 is completely covered by the stress layer in the reference direction. That is, the stress layer covers the protective layer completely in the length direction, and covers the protective layer partially in the width direction, and an area of the covered part may be determined as needed. In an embodiment, the stress layer 120 may cover a half of the protective layer 112. It can be seen that the stress layer 120 has a shape suitable for the magnetic layer 110, in a case that the magnetic layer 110 has a strip structure, the stress layer 120 also has a strip structure, which has a length equal to that of the magnetic layer 110 and a width smaller than that of the magnetic layer 110.

It should be noted that, in the present disclosure, the current I is supplied for inducing the rotation of the magnetic moment in the magnetoresistive tunnel junction 110, that is, the current I is supplied in a case that the data information is written. The current is supplied to the spin-orbit coupling layer 100, and the direction of the current I herein refers to a dimension in which the direction of the current I is located.

In addition, referring to FIG. 2 and FIG. 3, a buffer layer 102 may be arranged under the spin-orbit coupling layer 100, to guide the perpendicular anisotropy of the magnetic layer. The buffer layer 102 may be completely covered by the spin-orbit coupling layer 100 and may have substantially the same shape and size as the spin-orbit coupling layer 100. The material of the buffer layer 102 may be, for example, Ta, Ru, or the like.

The structure of the magnetoresistive random access memory is described in the above embodiment of the present disclosure. It is to be understood that the magnetoresistive random access memory may further include other components necessary for a specific application.

In order to understand the technical effects of the present disclosure more clearly, the principle of the rotation of the magnetic moment in the magnetoresistive random access memory according to the embodiment of the present disclosure is described below in accordance with FIG. 1. In a case of writing information into the magnetoresistive random access memory, the current I is supplied to the spin-orbit coupling layer, and the spin-up electrons or spin-down electrons in the spin-orbit coupling layer may be accumulated at the interface between the spin-orbit coupling layer 100 and the magnetic layer 110 due to the spin hall effect or the Rashba effect, such that the spin current is diffused into the magnetic layer 110, causing the ferromagnetic magnetic moment to be rotated toward into the surface. A stress layer covers a part of the protective layer along a direction of a current in the spin-orbit coupling layer, so that a stress is generated on the part of the magnetic layer locally due to the stress layer. In one aspect, the stress may affects the perpendicular anisotropy of the magnetic layer; in another aspect, the strength of an electric field at the interface between the magnetic layer and the protective layer is changed due to the stress, causing different Rashba effects at the two parts. Due to the above two aspects, a lateral asymmetric structure is formed in a direction perpendicular to the current source. In a case that a current is supplied to the spin-orbit coupling layer, the spin-orbit coupling effect in the magnetic layer is asymmetric due to the stress on the part of the magnetic layer, thereby realizing a deterministic switching of the magnetic moment under the function of the stress.

Figure 4:
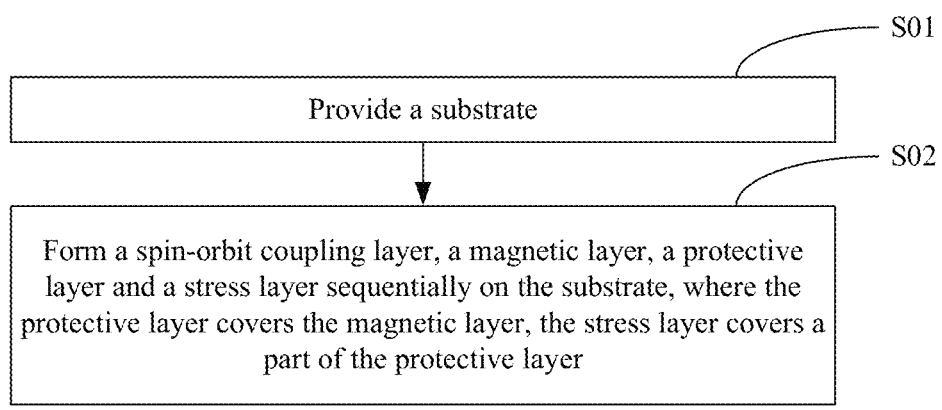
FIG. 4 is a schematic flow chart of a method for manufacturing a magnetoresistive random access memory according to an embodiment of the present disclosure.

The structure and principle of the magnetoresistive random access memory according to the embodiment of the present disclosure are clearly described above. In addition, a method for manufacturing a magnetoresistive random access memory is further provided according to the present disclosure, embodiments of which are described in detail below in accordance with the flow chart in FIG. 4.

First Embodiment

Figure 5:
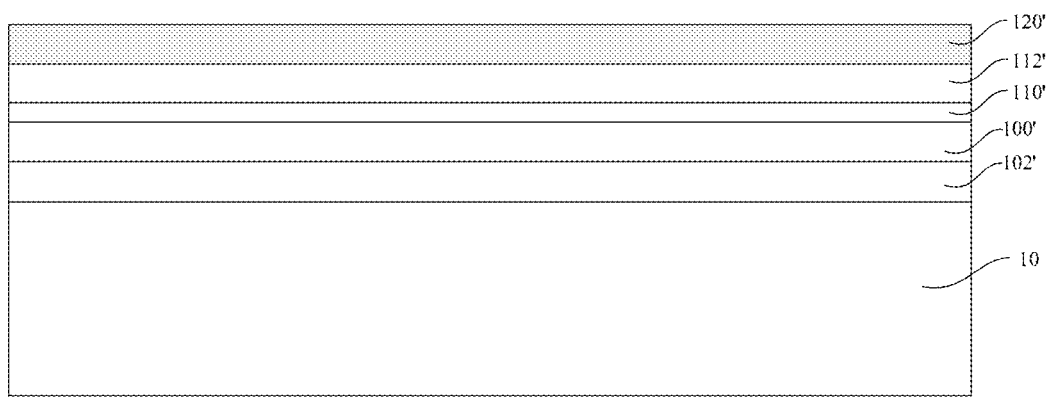
FIGS. 5 to 8A are schematic sectional views of structures formed in steps of a method for manufacturing a magnetoresistive random access memory according to the first embodiment of the present disclosure.

In step S01, a substrate 10 is provided, as shown in FIG. 5.

In the embodiment of the present disclosure, the substrate 10 is provided mainly for supporting. The substrate may be a semiconductor substrate or other substrate. The semiconductor substrate may be, for example, a Si substrate, a Ge substrate, a SiGe substrate, a silicon-on-insulator (SOI) substrate, or a germanium-on-insulator (GOI) substrate. In this embodiment, the substrate 10 may be a silicon substrate.

Figure 8:
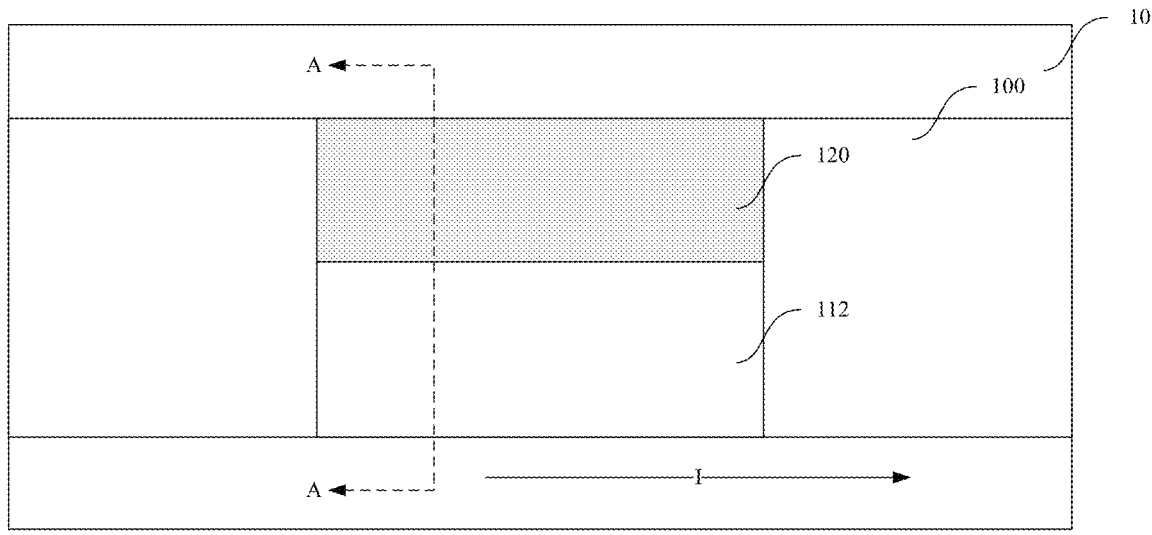
Figure 8A:
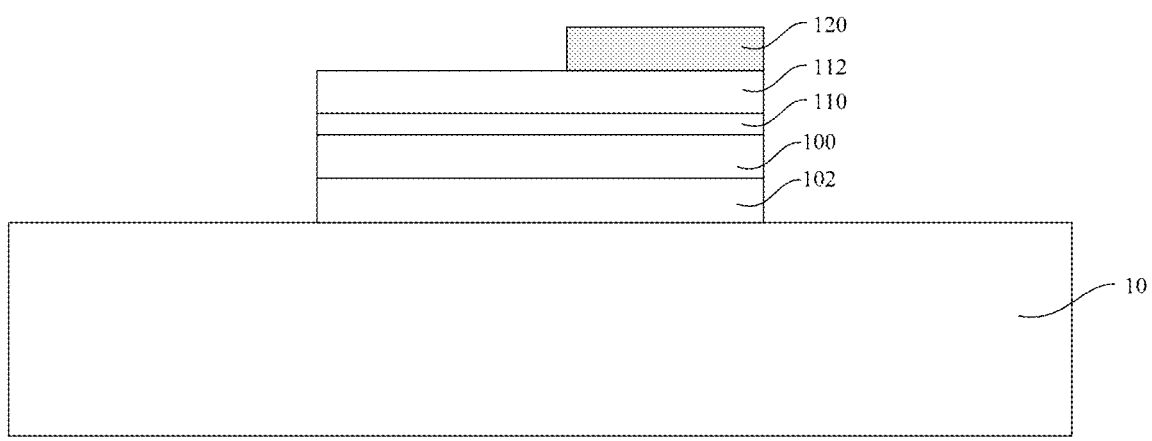

In step S02, as shown in FIG. 8 and FIG. 8A, a spin-orbit coupling layer 100, a magnetic layer 110, a protective layer 112 and a stress layer 120 are sequentially formed on the substrate 10. The protective layer 112 covers the magnetic layer 110. The stress layer 120 covers a part of the protective layer 112 along a direction of a current I in the spin-orbit coupling layer 100. The magnetic layer 110 has perpendicular anisotropy.

In this embodiment, after materials of the spin-orbit coupling layer, the magnetic layer, the protective layer, and the stress layer are sequentially grown on the substrate, the photolithography and etching processes are performed on the materials for multiple times, to sequentially form the spin-orbit coupling layer, the magnetic layer, the protective layer and the stress layer.

Specifically, in step S020, a spin-orbiting coupling layer material 100', a magnetic layer material 110', a protective layer material 112' and a stress layer material 120' are sequentially grown on the substrate 10, as shown in FIG. 5.

In an embodiment, a buffer layer material 102' is grown before growing the spin-orbiting coupling layer material 100'.

In an application, each of the layer materials may be grown through a suitable process, for example, a sputtering process, an epitaxial growth process or a physical vapor deposition process.

In an example, the buffer layer material 102' Ta, the spin-orbiting coupling layer material 100' Pt, the magnetic layer material 110' Co and the protective layer material 112 Ta may be sequentially grown through the magnetron sputtering process. Then, the stress layer material 120' SiN may be grown through the plasma chemical vapor deposition process. In an application, the stress layer of SiN may be capable of provide a compressive stress or a tensile stress by adjusting the process conditions, such as a deposition power, an intracavity pressure, a reaction gas flow ratio and temperature.

Figure 6:
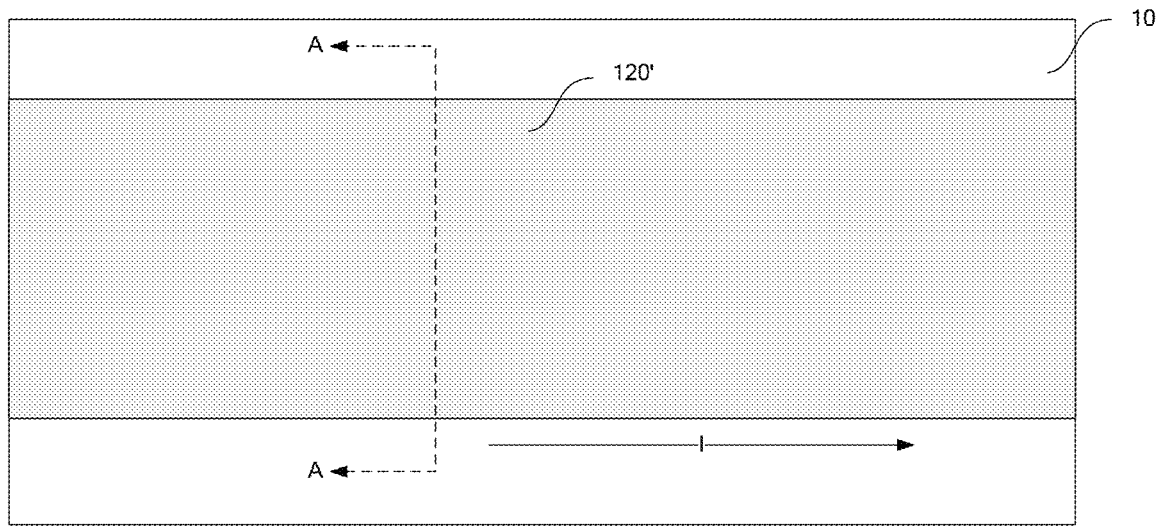
Figure 6A:
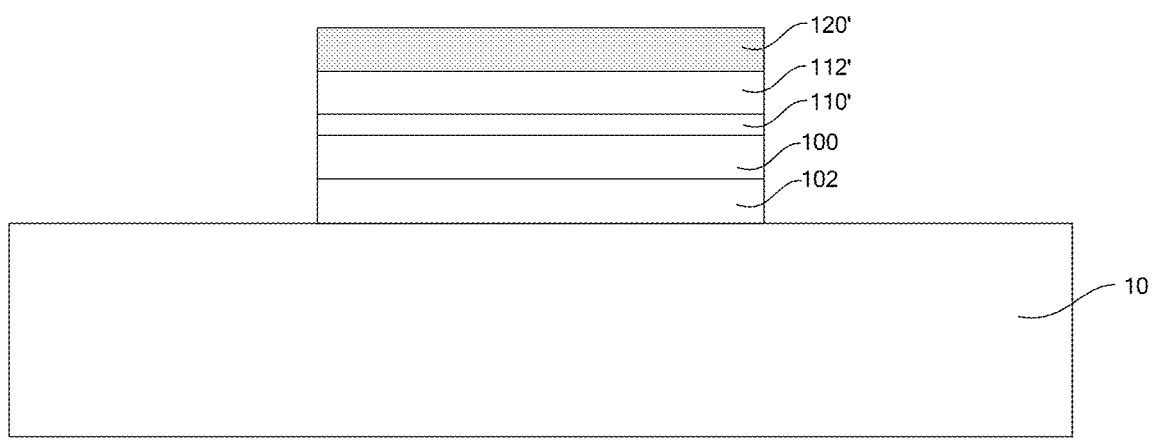

In step S021, the spin-orbit coupling layer material 100', the magnetic layer material 110', the protective layer material 112' and the stress layer material 120' are etched, to pattern the spin-orbit coupling layer material 100', to form the spin-orbit coupling layer 100, as shown in FIG. 6 (a top view) and FIG. 6A (a sectional view taken along a line A-A in FIG. 6).

In this step, the spin-orbiting coupling layer material 100' is patterned, to form the spin-orbiting coupling layer 100. During the process of patterning the spin-orbiting coupling layer material 100', the magnetic layer material 110', the protective layer material 112' and the stress layer material 120' above the spin-orbiting coupling layer material 100', and the buffer layer material 102' under the spin-orbiting coupling layer material 100' are also etched, and the buffer layer 102 having the same pattern as the spin-orbit coupling layer 100 is formed, as shown in FIG. 6 and FIG. 6A.

Figure 7:
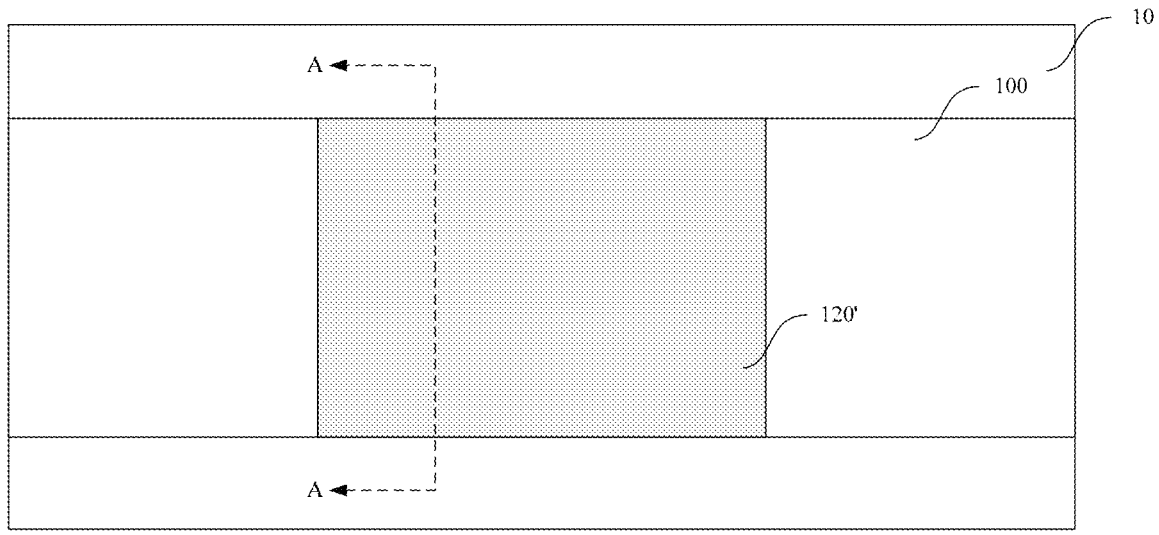
Figure 7A:
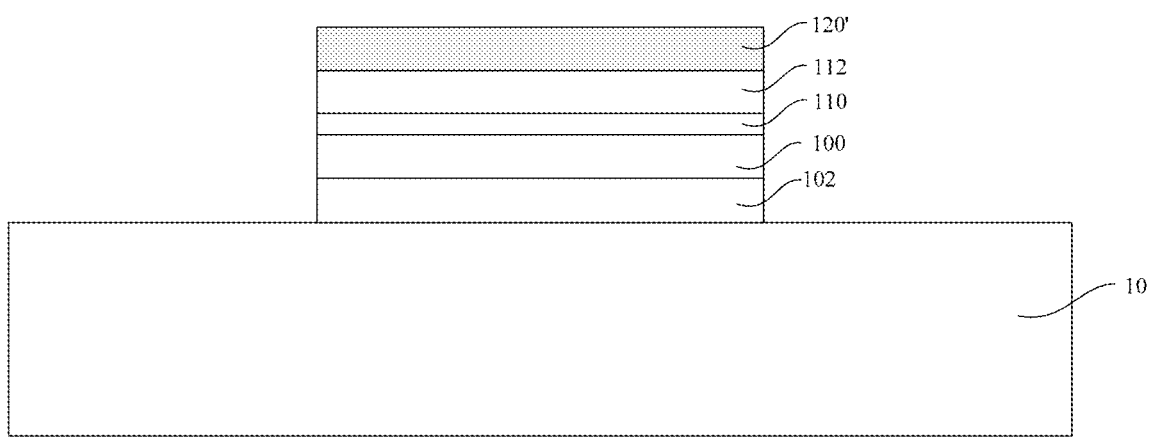

In step S022, the magnetic layer material 110', the protective layer material 112' and the stress layer material 120' are etched, to pattern the magnetic layer material 110' and the protective layer material 112', to form the magnetic layer 110 and the protective layer 112, as shown in FIG. 7 (a top view) and FIG. 7A (a sectional view taken along a line A-A in FIG. 7).

In this step, the magnetic layer material 110' and the protective layer material 112' are patterned to form the magnetic layer 110 and the protective layer 112. In the process of patterning the magnetic layer material 110' and the protective layer material 112', the stress layer material 120' above the magnetic layer 110 and the protective layer 112 is also etched to have the same pattern as the magnetic layer 110 and the protective layer 112, as shown in FIG. 7 and FIG. 7A.

In step S023, the stress layer material 120' is etched to form the stress layer 120, as shown in FIG. 8 (a top view) and FIG. 8A (a sectional view taken along a line A-A in FIG. 8).

In this step, the stress layer material 120' is patterned to form the stress layer 120. The stress layer 120 covers only a part of the protective layer 112 along the direction of the current I in the spin-orbit coupling layer 100, as shown in FIG. 8 and FIG. 8A.

In the above multiple patterning processes, a conventional patterning process may be used. In each patterning step, a photoresist layer of a desired pattern is formed through a photolithography process, and an etching process is performed for etching. In the embodiment of the present disclosure, the spin-orbit coupling layer 100 has a strip channel structure, and the magnetic layer 110 and the protective layer 112 do not completely cover the strip channel.

Specifically, at first, a first photoresist layer is formed through a spin-coating process. The first photoresist layer is exposed through the photolithography process, for patterning the spin-orbit coupling layer 100. The spin-orbit coupling layer material 100', the magnetic layer material 110', the protective layer material 112' and the stress layer material 120' are etched using the exposed first photoresist layer as a mask, to form a patterned spin-orbit coupling layer 100.

Next, the first photoresist layer is removed. A second photoresist layer is formed through the spin-coating process, and the second photoresist layer is exposed through the photolithography process, for patterning the magnetic layer. The magnetic layer material 110', the protective layer material 112' and the stress layer material 120' are etched using the exposed second photoresist layer as a mask, to pattern the magnetic layer material 110', the protective layer material 112' and the stress layer material 120', so as to form the magnetic layer 110 and the protective layer 112.

Next, the second photoresist layer is removed. A third photoresist layer is formed through the spin-coating process, and the third photoresist layer is exposed through the photolithography process, for patterning the stress layer. The stress layer is patterned using the exposed third photoresist layer as a mask to form the stress layer 120.

Second Embodiment

Different from the first embodiment, in the second embodiment, the stress layer is formed through a stripping process, and parts different from that of the first embodiment are mainly described below, and the same parts are not described again.

Figure 9:
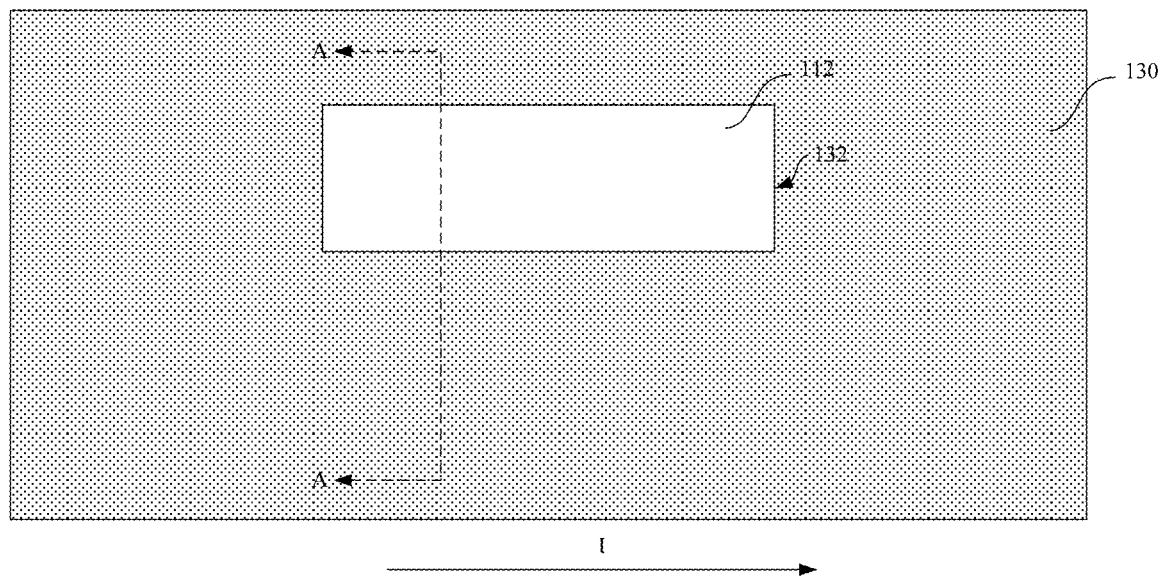
FIGS. 9 to 11A are schematic sectional views of structures formed in steps of a method for manufacturing a magnetoresistive random access memory according to the second embodiment of the present disclosure.
Figure 9A:
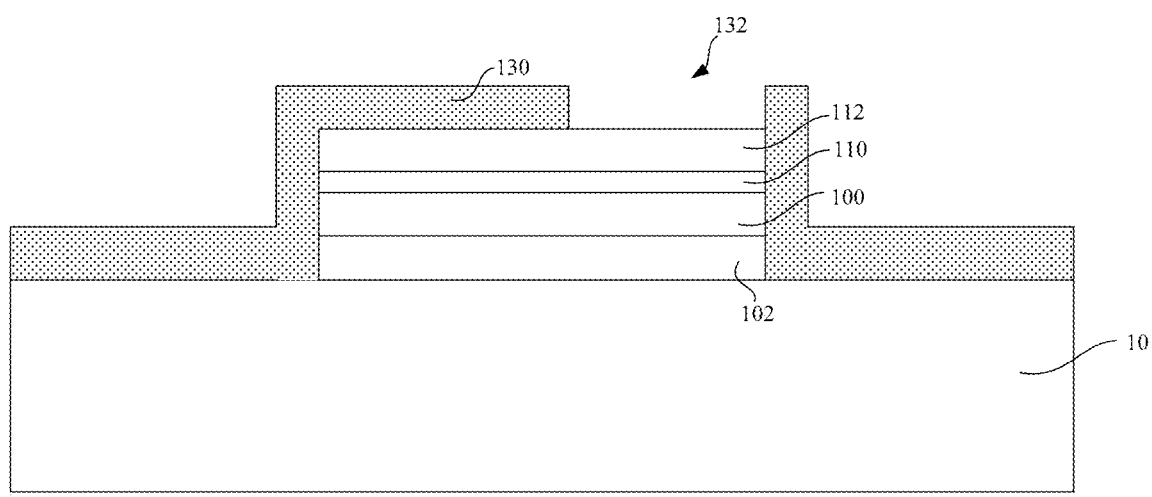

In step S201, a substrate 10 is provided, as shown in FIG. 9 (a top view) and FIG. 9A (a sectional view taken along a line A-A in FIG. 9).

In the embodiment of the present disclosure, the substrate 10 is provided mainly for supporting. The substrate may be a semiconductor substrate or other substrate. The semiconductor substrate may be, for example, a Si substrate, a Ge substrate, a SiGe substrate, a silicon-on-insulator (SOI) substrate, or a germanium-on-insulator (GOI) substrate. In this embodiment, the substrate 10 may be a silicon substrate.

Figure 11:
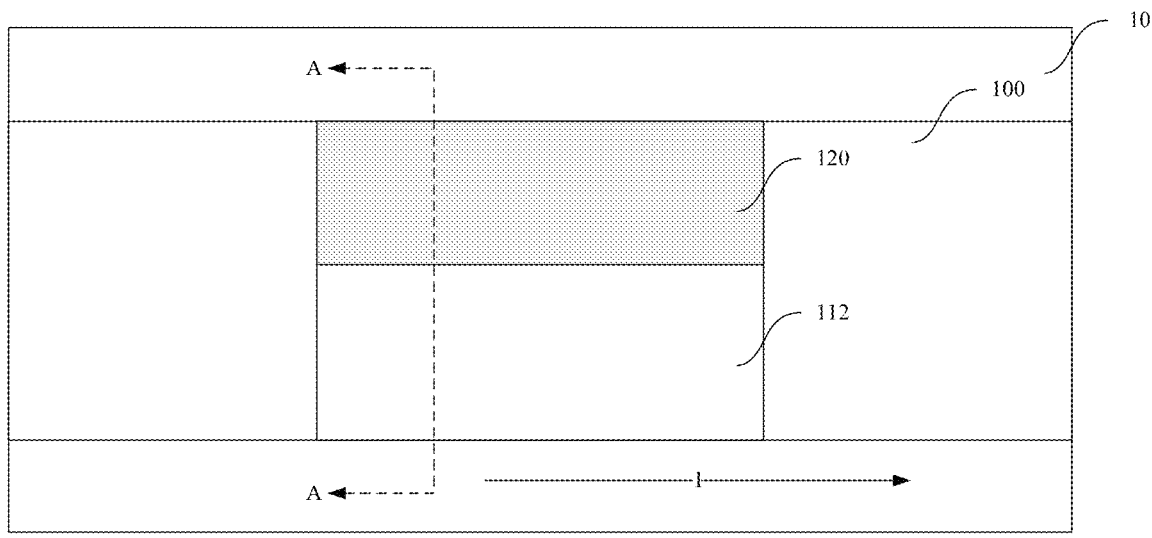
Figure 11A:
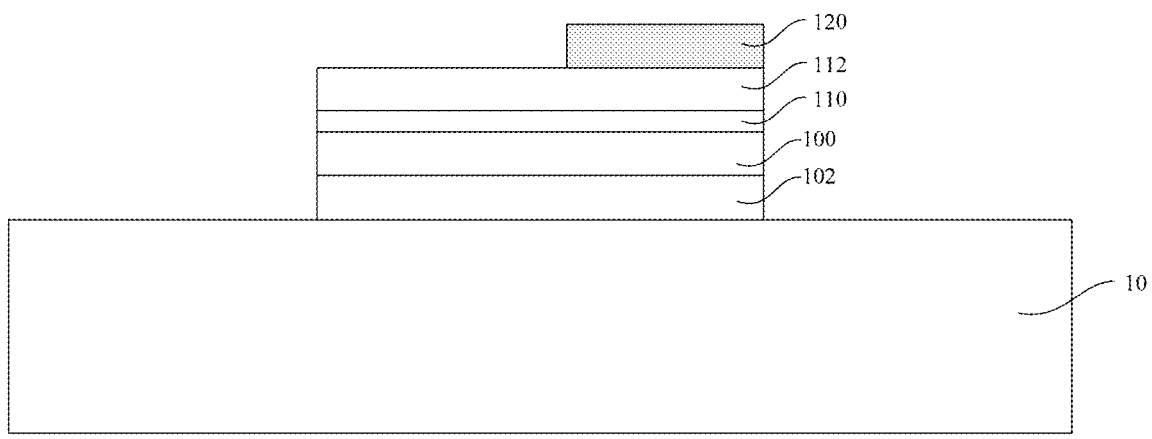

In step S202, as shown in FIG. 11 (a top view) and FIG. 11A (a sectional view taken along a line A-A in FIG. 11), a spin-orbit coupling layer 100, a magnetic layer 110, a protective layer 112 and a stress layer 120 are sequentially formed on the substrate 10. The protective layer 112 covers the magnetic layer 110. The stress layer 120 covers a part of the protective layer 112 along a direction of the current I in the spin-orbit coupling layer 100. The magnetic layer 110 has perpendicular anisotropy. The stress layer 120 is made of a dielectric material.

In the embodiment, after the spin-orbit coupling layer 100, the magnetic layer 110, and the protective layer 112 are formed, the stress layer 120 is formed through the stripping process.

Specifically, in step S2021, the spin-orbit coupling layer 100, the magnetic layer 110 and the protective layer 112 are sequentially formed on the substrate 10, as shown in FIG. 9 and FIG. 9A.

Firstly, the spin-orbit coupling layer material 100', the magnetic layer material 110' and the protective layer material 112' may be sequentially grown on the substrate 10. In an embodiment, the buffer layer material 102' may be grown before growing the spin-orbit coupling layer material 100'.

Next, the buffer layer 102, the spin-orbit coupling layer 100, the magnetic layer 110 and the protective layer 112 may be sequentially formed by performing the photolithography and etching processes twice.

For detailed description of the formation process and the material of each layer, reference may be made to the corresponding description of the first embodiment, which is not described herein again.

In step S2022, a second photoresist layer 310 is formed. The second photoresist layer 130 has an opening 132, and the opening exposes the part of the protective layer 112 along the direction of the current I in the spin-orbit coupling layer 100, as shown in FIG. 9 and FIG. 9A.

Figure 10:
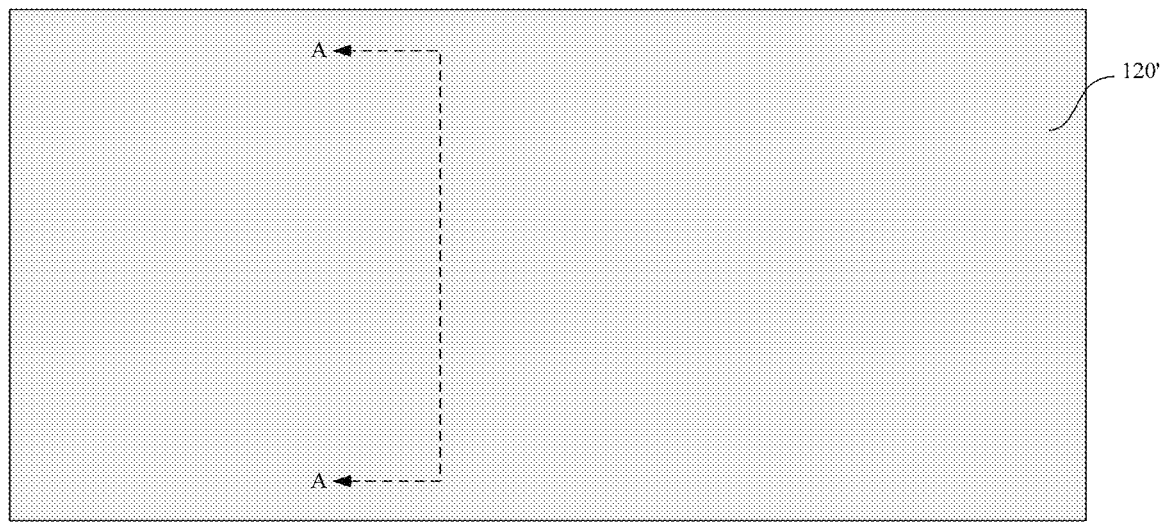
Figure 10A:
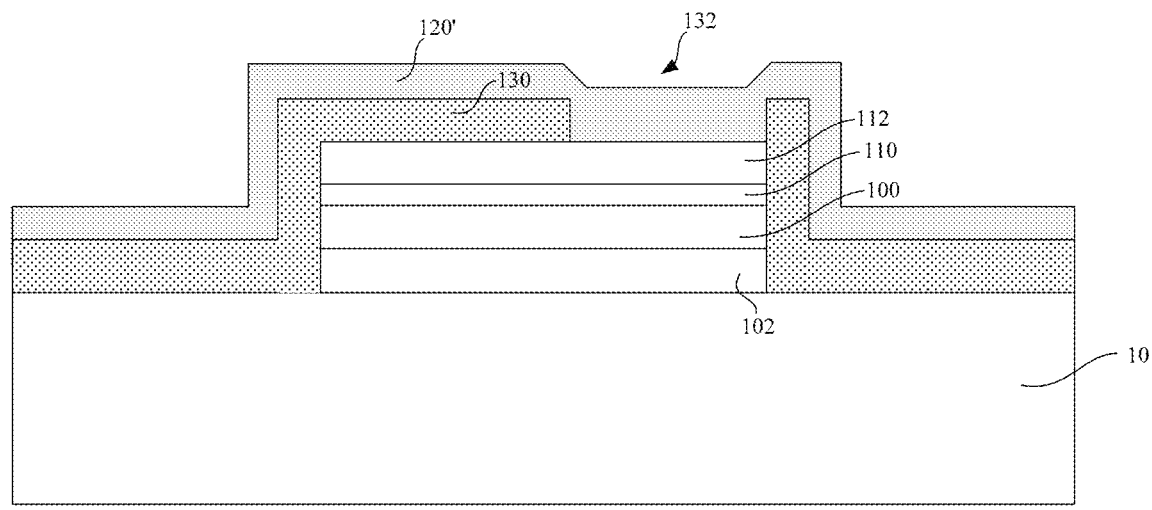

In step S2023, the stress layer material 120' is grown, as shown in FIG. 10 (a top view) and FIG. 10A (a sectional view taken along a line A-A in FIG. 10). Next, the second photoresist layer 130 is removed, to strip the stress layer material 120' on the second photoresist layer 130, to form the stress layer 120 at the opening, as shown in FIGS. 11 and 11A.

The second photoresist layer 130 may be formed on the substrate by spin-coating a photoresist material and performing the photolithography process. The opening 132 in the photoresist layer 130 has a pattern formed after the exposing process. The opening 132 exposes the part of the protective layer 112, and the exposed part of the protective layer is used for forming the stress layer, as shown in FIG. 9 and FIG. 9A.

Next, the stress layer material 120' is grown, for example, the stress layer material 120' of silicon nitride may be formed through the chemical vapor deposition process, as shown in FIG. 10 and FIG. 10A.

Next, the second photoresist layer 130 may be removed by a wet etching process. The stress layer material 120' on the second photoresist layer 130 is also removed together with the second photoresist layer 130, leaving only the stress layer 120 at the opening 132. Therefore, the stress layer 120 is formed only on the part of the protective layer 112, as shown in FIG. 11 and FIG. 11A.

Therefore, the magnetoresistive random access memory according to this embodiment is formed.

The above only show preferred embodiments of the present disclosure, although the disclosure is described as above in the preferred embodiments, they are not intended to limit the disclosure. Numerous alternations, modifications and equivalents can be made to the technical solutions of the present disclosure by those skilled in the art in light of the methods and technical contents disclosed herein without departing from the scope of the present disclosure. Therefore, any simple changes, equivalent variations and modifications on the above embodiments made according to the technical essence of the present disclosure without departing the content of the technical solutions of the present disclosure fall within the scope of protection of the technical solutions of the present disclosure.

The invention claimed is:

1. A magnetoresistive random access memory, comprising:
    a spin-orbit coupling layer;
    a magnetic layer on the spin-orbit coupling layer, wherein the magnetic layer has perpendicular anisotropy;
    a protective layer covering the magnetic layer; and
    a stress layer covering a part of the protective layer along a direction of a current in the spin-orbit coupling layer.

2. The magnetoresistive random access memory according to claim 1, wherein the stress layer is made of SiN, SiO$_2$, TiN, or Ti.

3. The magnetoresistive random access memory according to claim 1, wherein the spin-orbit coupling layer is a metal layer, an antiferromagnetic layer or a topological insulator layer.

4. The magnetoresistive random access memory according to claim 1, further comprising a buffer layer under the spin-orbit coupling layer.

5. The magnetoresistive random access memory according to claim 1, wherein a material of the magnetic layer is Co, Fe, CoPd, FePd, MnGa, CoFeB or FePt.

6. The magnetoresistive random access memory according to claim 1, wherein the magnetic layer has a strip shape, and the stress layer has a strip shape.

7. A method for manufacturing a magnetoresistive random access memory, comprising:
    providing a substrate; and
    forming a spin-orbit coupling layer, a magnetic layer, a protective layer and a stress layer sequentially on the substrate, wherein the protective layer covers the magnetic layer, the stress layer covers a part of the protective layer along a direction of a current in the spin-orbit coupling layer, the magnetic layer has perpendicular anisotropy.

8. The method for manufacturing a magnetoresistive random access memory according to claim 7, wherein the forming the spin-orbit coupling layer, the magnetic layer, the protective layer and the stress layer sequentially on the substrate comprises:
    growing a spin-orbit coupling layer material, a magnetic layer material, a protective layer material and a stress layer material sequentially on the substrate;
    etching the spin-orbit coupling layer material, the magnetic layer material, the protective layer material and the stress layer material, to pattern the spin-orbit coupling layer material, to form the spin-orbit coupling layer;
    etching the magnetic layer material, the protective layer material and the stress layer material, to pattern the magnetic layer material and the protective layer material, to form the magnetic layer and the protective layer; and
    etching the stress layer material to form the stress layer.

9. The method for manufacturing a magnetoresistive random access memory according to claim 7, wherein the forming the spin-orbit coupling layer, the magnetic layer, the protective layer and the stress layer sequentially on the substrate comprises:
    forming the spin-orbit coupling layer, the magnetic layer and the protective layer sequentially on the substrate;
    forming a second photoresist layer having an opening, wherein the opening exposes the part of the protective layer along the direction of the current in the spin-orbit coupling layer;
    growing a stress layer material; and
    removing the second photoresist layer to strip the stress layer material on the second photoresist layer, to form the stress layer at the opening.

10. The method for manufacturing a magnetoresistive random access memory according to claim 7, wherein the stress layer is made of SiN, SiO$_2$, TiN or Ti.

11. The method for manufacturing a magnetoresistive random access memory according to claim 7, wherein the magnetic layer has a strip shape, and the stress layer has a strip shape.

12. The method for manufacturing a magnetoresistive random access memory according to claim 7, wherein before the forming the spin-orbit coupling layer on the substrate, the method for manufacturing a magnetoresistive random access memory further comprises:
    forming a buffer layer on the substrate.

* * * * *